United States Patent [19]

Mawhinney et al.

[11] 4,079,325

[45] Mar. 14, 1978

[54] MICROWAVE FREQUENCY DISCRIMINATOR

[75] Inventors: Daniel David Mawhinney, Livingston, N.J.; Zygmond Turski, Selden, N.Y.

[73] Assignee: RCA Corporation, New York, N.Y.

[21] Appl. No.: 714,356

[22] Filed: Aug. 16, 1976

[51] Int. Cl.² .................... H03K 11/00; H03K 9/06
[52] U.S. Cl. ............................ 328/140; 307/233 R; 324/78 J; 307/261
[58] Field of Search .............. 324/77 E, 77 F, 78 J, 324/78 R, 119; 307/233 R, 261; 328/140

[56] References Cited

U.S. PATENT DOCUMENTS

| | | | |
|---|---|---|---|
| 3,445,767 | 5/1969 | Beard | 324/78 J |
| 3,696,252 | 10/1972 | Chapman | 307/233 R |
| 3,723,891 | 3/1973 | Whiteley | 307/233 R |
| 3,775,681 | 11/1973 | Konrad | 324/78 R |
| 3,784,845 | 1/1974 | Haas | 307/233 R |
| 3,792,290 | 2/1974 | Brocker | 307/233 R |
| 3,806,808 | 4/1974 | Willmore | 324/78 R |

*Primary Examiner*—John S. Heyman
*Attorney, Agent, or Firm*—H. Christoffersen; Joseph D. Lazar; Robert M. Rodrick

[57] ABSTRACT

A microwave frequency discriminator including a multi-stage limiter-amplifier and a detector in an environment of a wide band RF signal of varying power level. The limiter-amplifier comprises a plurality of cascaded saturated amplifiers including an unsaturated output-stage amplifier. The response of the unsaturated output stage amplifier is such that the RF power varies substantially linearly with the input frequency over a predetermined bandwidth. The detector converts the RF signal to a linear dc signal.

9 Claims, 3 Drawing Figures

MICROWAVE FREQUENCY DISCRIMINATOR

The Government has rights in this invention pursuant to Contract No. N00039-74-C-0227 awarded by the Department of the Navy.

BACKGROUND OF THE INVENTION

1. Field of the Invention

This invention relates to microwave frequency discriminators.

2. Description of the Prior Art

Techniques and devices for the rapid and accurate determination of an unknown signal frequency are of significant interest in modern communication systems, in particular, for electronic counter measure (ECM) systems operating at microwave frequencies. Microwave frequency discriminators capable of converting incoming unknown frequencies into voltages for processing are often used in ECM systems. A microwave frequency discriminator may be defined as a circuit that provides an output voltage which is a predetermined function of and usually proportional to the frequency of an incoming signal. The discriminator voltage output versus frequency response, commonly termed the "discriminator characteristic," is the response in which the output voltage varies nearly linearly with respect to frequency over a predetermined frequency bandwidth. The bandwidth is generally determined by the slope, linearity, and resolution of the discriminator and is the frequency range over which the discriminator provides an unambiguous voltage output which is related to the input frequency.

A typical prior art broadband microwave discriminator such as shown by FIG. 1 utilizes passive elements such as transmission lines or an arrangement of lumped elements to vary the power level of the input signal applied to a detector diode as a function of frequency. Such a discriminator formed of various passive components as shown in FIG. 1 generally, disadvantageously, has a large number of connections between the components. Such interconnections of the components within the discriminator often produce impedance mismatches resulting in undesirable inflection points in the relation between input frequency and output voltage such that a certain voltage can occur at several frequencies. Such distortions in the discriminator characteristic curve limit the broadband resolution of the discriminator minimizing thereby the accuracy of the system.

Most prior art discriminators are preceeded with a limiter to provide a constant power input to the discriminator, whereby the output voltage of the discriminator is a function of frequency alone. An interface between the limiter and the discriminator further complicates the discriminator response and typically results in worse linearity. Limiters may not be required, however, if the incoming signal has a relatively constant magnitude. One of the problems introduced by the limiter is that the power output is not always ideally constant with frequency. In particular, a fall-off of the voltage at the end of the frequency band of the limiter combined with the linear frequency-voltage slope of the discriminator changes the overall discriminator characteristic resulting in an undesirably ambiguous frequency-voltage relationship.

As an example of a commonly used prior art passive element discriminator, attention is directed to FIG. 1 of the drawing. Discriminator 10 comprises a limiter 12 which receives an incoming RF signal 14 of unknown frequency and variable power level and converts signal 14 to an RF signal 16 of constant power level. Signal 16 is applied to a 3 db hybrid coupler 18 which splits signal 16 into two signal components. One component of the split signal is transmitted through a short path 20 and the other component through a longer path 22. The different path lengths produce different phase shifts of the two signal components. The split signals are recombined in another hybrid coupler 24. The power levels at the two outputs of the 3 db hybrid coupler 24 vary with frequency as a result of the vector summation of the two split signals having a differential phase shift. Detector diodes 26 and 28 are utilized to demodulate the frequency dependent signal received from coupler 24 and convert the signal into a dc voltage. A video amplifier 30 may be used to sum or compare and amplify the dc signal for subsequent measurement or display.

SUMMARY OF THE INVENTION

According to the present invention, a microwave frequency discriminator includes amplifier means responsive to an input RF signal of substantially constant power level for generating an output RF signal having its power varying substantially linearly as a function of the frequency of the RF input signal over the frequency bandwidth of the input RF signal. A detector responsive to the output RF signal generates a dc signal varying substantially linearly as a function of the frequency of the input RF signal.

In an environment of a wide band input RF signal of varying power level, limiter means may be used to provide an RF signal of substantially constant power level to the amplifier means.

DETAILED DESCRIPTION OF THE PREFERRED EMBODIMENTS

Figure 1:
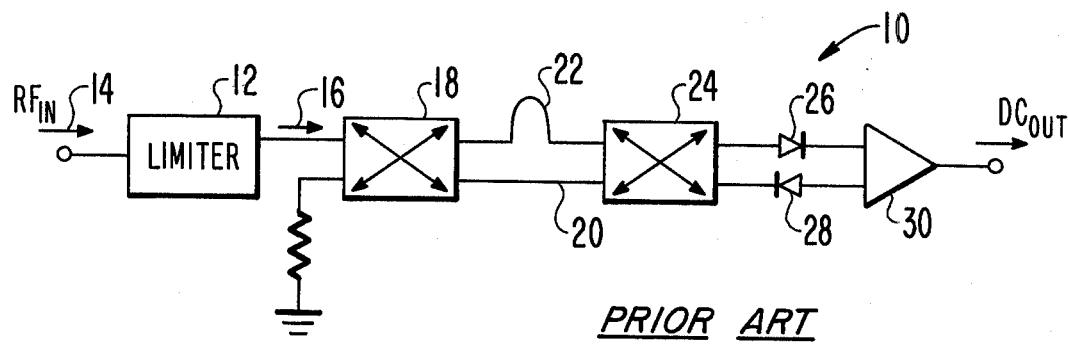
FIG. 1 is a schematic representation of a prior art frequency discriminator, described in detail in the "Description of the Prior Art" section above.
Figure 2:
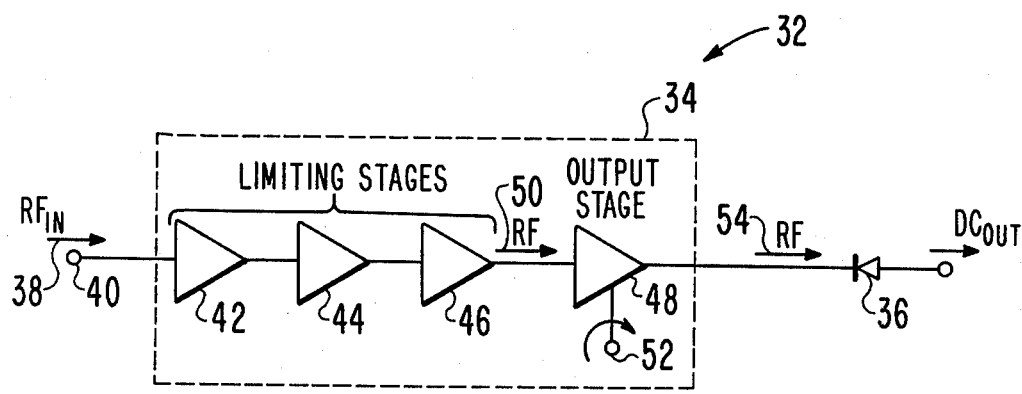
FIG. 2 is a schematic diagram of a frequency discriminator of the present invention.

Referring to the drawing, there is shown in FIG. 2 a schematic diagram of a microwave frequency discriminator 32 according to the present invention. Discriminator 32 comprises a limiter-amplifier 34 and a detector diode 36. The limiter-amplifier 34 is formed of a number of limiting stages 42, 44, 46 and a non-limiting output stage 48.

An RF input signal 38 of unknown frequency and varying power level is applied to the input 40 and processed by limiter-amplifier 34. As explained above in the prior art section, limiters are generally used in discriminator circuits where an incoming signal does not have a relatively constant power level. In accordance with one embodiment, the present invention is applicable in such conditions of varying power level input signals where the utilization of a limiter to convert the varying power level signal to a constant power level signal is required.

Figure 3:
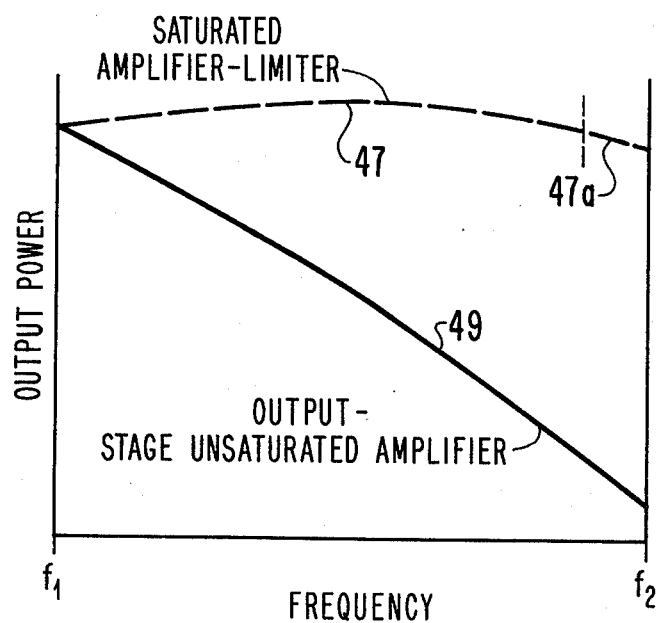
FIG. 3 shows the frequency-power response curves utilized in describing the present invention.

Amplifiers 42, 44, 46 and 48 are, for example, transistor amplifiers, tunnel-diode amplifiers or transferred electron amplifiers (TEA) or any combination of such amplifiers. Limiters typically arranged as cascaded amplifier stages are arranged to operate in a saturated state to provide the signal limiting function. In general, to operate an amplifier in a saturated state, the properties of the amplifier and its operating conditions are selected so that beyond predetermined input power levels the amplifier output power will be substantially constant. By operating the amplifiers in saturation, a substantially constant output power, independent of the power and frequency of the incoming signal is thus obtained. Cascading a plurality of saturated amplifiers provides increased dynamic range of the limiters. A typical frequency response of a saturated amplifier or limiter is shown in FIG. 3 by the dashed curve 47. The output power of the limiter is substantially constant over a frequency range of $f_1$ to $f_2$ with a "roll-off" (region 47a) as the response approaches the higher frequency $f_2$.

According to this embodiment of the present invention, amplifiers 42, 44 and 46 are arranged to operate in a saturated state and amplifier 48, the output stage, in an unsaturated state. Cascaded amplifiers 42, 44, and 46 operating in a saturated state perform a limiting function and convert the incoming varying power level RF signal 38 to an RF signal 50 of relatively constant power level. Output stage amplifier 48 operates in an unsaturated state in the frequency range of interest between frequency $f_1$ and $f_2$.

Any suitable amplifier known in the art may be used to provide such an operating characteristic, as by, for example, operating an amplifier in the linear portion of its "roll-off" range. If desired, an amplifier not having such a roll-off characteristic may be used by providing a suitable frequency response adjustment 52 for changing the response of the amplifier to produce an RF signal 54 that is frequency dependent rather than operating in a region that is frequency independent (i.e., saturated). Thus, frequency response adjustment 52 may be formed of a suitable capacitance to provide amplifier roll-off, i.e., a change of amplifier gain with respect to frequency starting at frequency $f_1$. Adjustment 52 may be also achieved by either providing a predetermined bias voltage applied to output-stage amplifier 48 or by using microwave tuning elements to vary the impedance conditions of an amplifier 48 in a microstrip transmission line configuration to "roll-off" the response linearly starting at frequency $f_1$. The output-power versus frequency response of an output-stage amplifier operating in an unsaturated state is shown by the solid line 49 in FIG. 3. Over the predetermined frequency bandwidth $f_1$ to $f_2$ the output-power varies nearly linearly with frequency closely approximating an ideal discriminator characteristic. In an operative system, the frequency range of $f_1$ to $f_2$ is about 4 GHz where the frequency $f_1$ is in the order of 7 GHz.

The frequency dependent RF signal 54 from the limiter amplifier 34 is applied to detector diode 36. The RF signal 54 is demodulated by detector diode 36 and converted into a dc signal for subsequent processing (not shown). It is preferable that detector diode 36 be operated in its square law region. A detector operating in the square law region exhibits an input-output relation, $V_{out} = kV_{in}^2$, where $k$ is the detector sensitivity factor, such that the output dc voltage will vary substantially linearly as a function of the input signal.

While the preferred embodiment of the invention as described herein utilizes three amplifiers in the limiting stages and one output-stage amplifier, it should be understood that any suitable number of amplifiers may be used depending upon the desired discriminator requirements with at least one limiter stage amplifier and one output stage amplifier.

In practicing the invention in an environment where the input wide band RF signal has a substantially constant power level, it will be appreciated by those skilled in this art that saturated amplifiers 42, 44 and 46 functioning as limiters may not be required. In such an environment an unsaturated frequency responsive amplifier 48 in combination with the detector 36 will respond to the input wide band RF signal to provide the desired discriminator characteristic. Although the invention can be used to scan for and detect signals of an unknown frequency in electronic counter measure (ECM) systems, the invention can also be used in scanning for frequency modulated signals modulated with information signals. The detector output will generate a dc signal representing the modulating signal.

What is claimed is:

1. A microwave frequency discriminator comprising:
    amplifier means responsive to an input RF signal of substantially constant power level of generating an output RF signal having its power varying substantially linearly as a function of the frequency of said input RF signal over the frequency bandwidth of said input RF signal;
    said amplifier means including means for operating said amplifier means in an unsaturated condition such that said output RF signal is dependent upon frequency; and
    detector means responsive to said output RF signal for generating a dc signal varying substantially linearly as a function of the frequency of said input RF signal.

2. A microwave frequency discriminator according to claim 1, wherein said detector means comprises a square law detector.

3. A microwave frequency discriminator according to claim 1, wherein said operating means comprises a predetermined capacitance.

4. A microwave frequency discriminator according to claim 1, wherein said operating means comprises means for biasing said amplifier means.

5. A microwave frequency discriminator comprising:
    signal limiting means responsive to an input RF signal of varying power level for generating an RF signal of substantially constant power level;
    amplifier means responsive to said RF signal of substantially constant power level for generating an output RF signal having its power varying substantially linearly as a function of the frequency of said input RF signal over the frequency bandwidth of said input RF signal;
    said amplifier means including means for operating said amplifier means in an unsaturated condition such that said output RF signal is dependent upon frequency; and
    detector means responsive to said output RF signal for generating a dc signal varying substantially linearly as a function of the frequency of said input RF signal.

6. A microwave frequency discriminator according to claim 5, wherein said detector means comprises a square law detector.

7. A microwave frequency discriminator according to claim 5, wherein said operating means comprises a predetermined capacitance.

8. A microwave frequency discriminator according to claim 5, wherein said operating means comprises means for biasing said amplifier means.

9. A microwave frequency discriminator according to claim 5, wherein said limiting means comprises amplifier means arranged by the selection of its operating properties to operate in a saturated condition such that the generated RF signal of said limiting means is frequency independent.

* * * * *